United States Patent [19]
Arai et al.

[11] 3,894,672
[45] July 15, 1975

[54] WIRE BONDING EQUIPMENT

[75] Inventors: Fumio Arai; Tetsuya Takagaki, both of Tokyo, Japan

[73] Assignee: Hitachi, Ltd., Japan

[22] Filed: June 4, 1974

[21] Appl. No.: 476,312

[30] Foreign Application Priority Data

Sept. 12, 1973 Japan .......................... 48-102039

[52] U.S. Cl. ............................................ 228/4.5
[51] Int. Cl. ............................................ B23k 21/00
[58] Field of Search ............................ 228/3, 4, 5, 6

[56] References Cited

UNITED STATES PATENTS

| | | | |
|---|---|---|---|
| 3,313,464 | 4/1967 | Avedissian | 228/4 X |
| 3,430,835 | 3/1969 | Grable et al. | 228/4 |
| 3,643,321 | 2/1972 | Field et al. | 228/4 X |
| 3,819,102 | 6/1974 | Isobe | 228/4 X |

*Primary Examiner*—Donald G. Kelly
*Assistant Examiner*—Marc R. Davidson
*Attorney, Agent, or Firm*—Craig & Antonelli

[57] ABSTRACT

A wire bonding equipment having an actuating rod which moves in contact with a cam profile, and a rockable arm which is contacted with an engaging portion of the actuating rod at one end and which has a capillary at the other end, comprising a mechanism which adjusts the position of the engaging portion, whereby the descent stopping position of the capillary can be set as desired.

21 Claims, 2 Drawing Figures

WIRE BONDING EQUIPMENT

The present invention relates to a wire bonding equipment, and more particularly to a control mechanism for the vertical motions of a capillary.

In assembling a semiconductor device such as transistor and IC, an electrode of an element and an external lead are connected by wire. The wire is held by a tapered ceramic tube called the capillary. The capillary carries out the bonding in such way that, after transporting the wire in the horizontal X and Y directions, it moves in the vertical Z direction. In this equipment, when any interference is existent between the movements in the X and Y directions and the movement in the Z direction, an error occurs in the bonding position and an inferior connection arises. Therefore, a mechanism has already been proposed which prevents the interference between the movements in the X and Y directions and the movement in the Z direction and which effects the motion of the capillary in the Z direction without any error and smoothly.

The wire bonding equipment with this proposed mechanism assembled therein, however, controls the vertical motion of the capillary by means of a cam, so that when the capillary is exchanged, the spacing between the lower end of the capillary and a semiconductor pellet or a lead becomes larger or smaller than a predetermined spacing. When the spacing is too large, the part to be pressedly bonded of gold wire held by the capillary is not depressed very strongly, and the contact state of the part with an electrode portion or the lead on the pellet is degraded. When the spacing is too small, the pressed bonding part of the gold wire is excessively crushed, and the intensity of the joined portion lowers. When the capillary ascends, the gold wire severs at the joined portion, and it rises therewith and comes off.

The distance between the capillary and the lead becomes small also due to wear of the sharp end of the capillary, so that the above-described problem is raised.

Accordingly, it is an object of the present invention to provide a wire bonding equipment which avoids the simple means to shortcomings and drawbacks encountered in prior proposed mechanisms.

It is a further object of the present invention to provide a wire bonding equipment which effects the wire bonding in a desired state by adjusting the height of a capillary.

In order to accomplish such object, in a mechanism in which an arm is actuated by means of an actuating rod vertically moved by a cam and an engaging portion provided on the actuating rod, the present invention makes it possible to adjust the position of the engaging portion.

These and further objects, features and advantages of the present invention will become more apparent from the following description when taken in connection with the accompanying drawing which shows, for the purpose of illustration only, one embodiment in accordance with the present invention and wherein.

Figure 1:
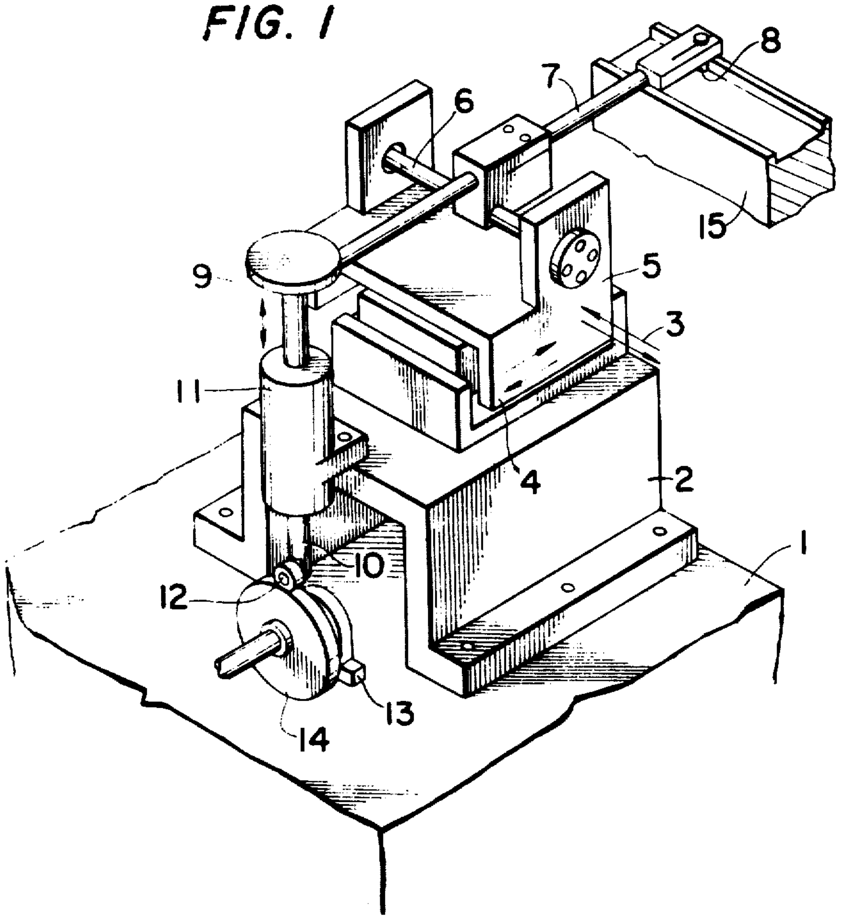
FIG. 1 is a perspective view of a proposed wire bonding arrangement.

As shown in FIG. 1, the proposed mechanism is such that, on a fixed base 2 fixed on a machine bed 1, a moving base 5 is so secured as to be movable in the horizontal X and Y directions (arrows 3 and 4). A supporting shaft 6 is mounted at an upper part of the moving base 5 along the X direction, an arm 7 orthogonally intersecting with the supporting shaft 6 and extending in the Y direction is mounted at the central part of the shaft, and a capillary 8 for guiding and holding wire is mounted at an extreme end of the arm 7 in the Z direction. A spherical protrusion (not shown) is provided at an upper surface part of the other end of the arm 7, while a moving rod 10 having a flange portion 9 is suspended over the spherical protrusion. The moving rod 10 extends in the Z direction, its outer periphery is supported by a guide sleeve 11 provided on the fixed base 2, and it is vertically slidable. Mounted at the lower end of the moving rod 10 is a roller 12, the outer periphery of which is held in contact with the outer periphery of a cam 14 which is mounted on a bearing 13 fixed to the machine bed 1. Accordingly, the actuating rod 10 moves up and down with the turning of the cam 14, and transmits the motion of its flange portion 9 to the arm 7 through the spherical protrusion. In this case, owing to the structure in which the up-and-down motions of the actuating rod 10 are transmitted to the arm 7 through the medium of the flange portion 9 as well as the spherical protrusion, the arm 7 can be reliably caused to ascend and descend even when the moving base 5 is adjusted in the X direction or the Y direction. Under the capillary 8, there is disposed a guide base 15 which conveys a lead frame with a semiconductor element attached thereto.

In accordance with the mechanism of FIG. 1, since the motion of the capillary 8 in the Z direction is substantially directly transmitted from the flange portion 9 moving up and down and via the spherical protrusion contacted therewith, the room for an error to intervene in the course is very little, and the motion in the Z direction can be bestowed on the capillary without any error.

Even when the motions in the X and Y directions are given to the capillary, the spherical projection of the arm 7 merely slides on the lower surface of the flange portion 9, and the motion in the Z direction is not affected thereby. Likewise, the motion of the flange portion 9 in the Z direction does not affect the motions of the capillary 8 in the X and Y directions. Consequently, the motion in the Z direction can be given to the capillary 8 independently of the motions in the X and Y directions.

Figure 2:
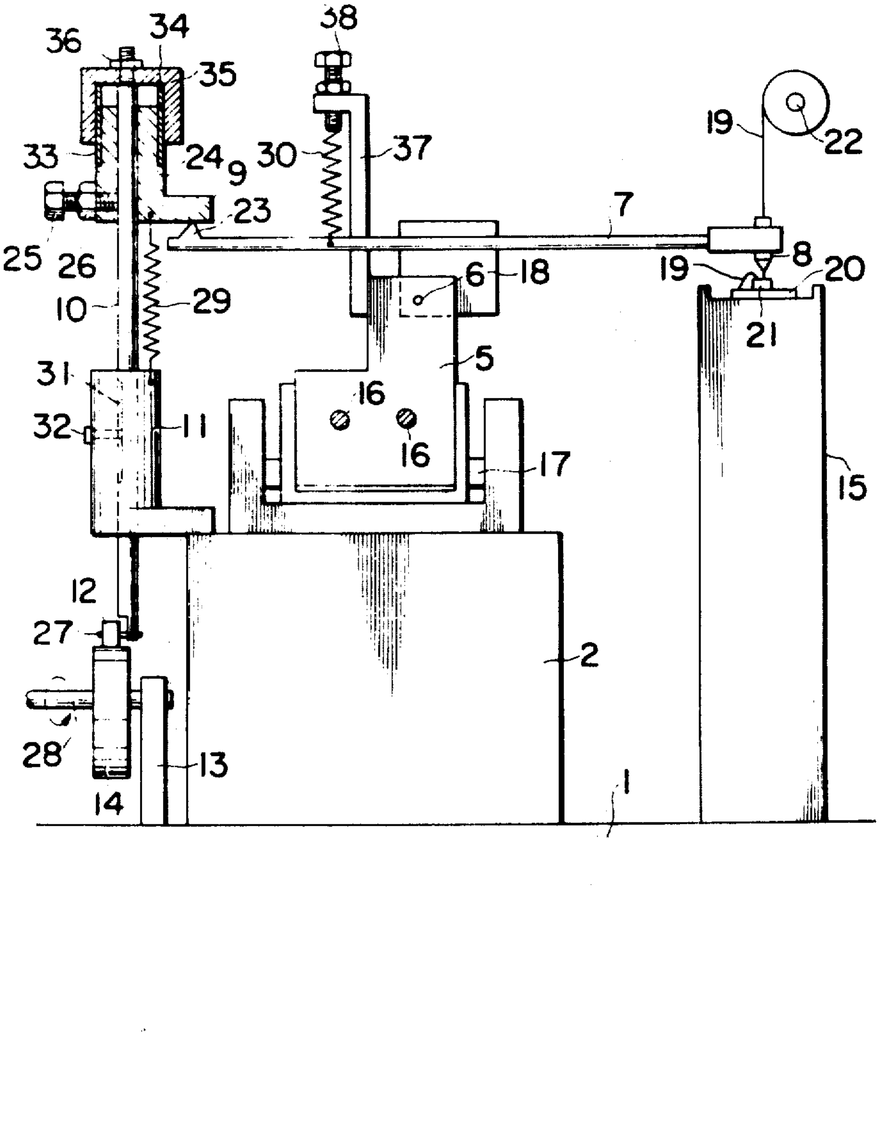
FIG. 2 is a partial sectional view of the wire bonding arrangement according to the present invention.

FIG. 2 shows an embodiment of the wire bonding equipment of the present invention. Referring to the figure, a fixed base 2 is fixed on a machine bed 1. On the upper surface of the fixed base 2, a moving base 5 is mounted which moves in the horizontal X and Y directions along sliding shafts 16 and 17. A supporting shaft 6 is disposed over the moving base 5 and in a manner to extend along the X direction, an arm 7 orthogonally intersecting with the supporting shaft 6 and extending in the Y direction is attached to the supporting shaft 6 through fitting 18, and a capillary 8 for holding wire 19 is attached to an extreme end of the arm in the Z direction or the vertical direction. Obtaining the wire 19 from the overlying spool 22, the capillary 8 couples a lead portion of a lead frame 20 on the underlying guide base 15 and an electrode portion of an element 21 mounted at the center of the lead frame 20.

On the other hand, a spherical protrusion 23 is provided on the upper surface of the other end of the arm 7, a contact member 24 having a flange portion 9 lies over the spherical protrusion 23, and the contact member 24 is provided with a moving rod 10 which penetrates vertically through the cental part thereof and which is integrally fixed thereto through a bolt 25 and a lock nut 26. The moving rod 10 has its outer peripheral portion supported by a guide sleeve 11 mounted on the fixed base 2, and is slidable in the vertical ascent and descent directions. Further, a roller 12 is supported at the lower end of the moving rod 10 by means of a shaft 27 extending in the horizontal direction, and the outer periphery of the roller 12 is in contact with the outer periphery of a cam 14. The cam 14 is mounted on a rotary shaft 28 which is journaled in a bearing 13 fixed to the machine bed 1. With the rotation of the cam 14 the moving rod 10 moves up and down, to rock the arm 7 about the supporting shaft 6 through the flange portion 9 of the contact member 24 secured to the moving rod 10 and to thus move the capillary 8 up and down in the Z direction.

In order that the cam 14 and the roller 12 may be contacted at all times, a coiled tension spring 29 is extended between the guide sleeve 11 and the contact member 24. Additionally, in order that the spherical protuberance 23 at the other end of the arm 7 and the lower surface of the flange portion 9 may be contacted at all times, a bolt 38 is provided on fitting 37 attached to the moving base 5, and a tension spring 30 secured thereto is coupled with the arm 7. The bonding pressure at the sharp end of the capillary 8 can be adjusted by shifting the bolt 38 up or down.

When, in the up-and-down motions of the moving rod 10, it moves while turning within the guide sleeve 11, the state of the contact between the roller 12 and the cam 14 etc. changes. To the end of checking the turning, a long groove 31 is provided in the axial direction of the moving rod 10, and a bolt 32 for preventing the turning is mounted on the guide sleeve 11 in such manner that its force end faces and engages in the long groove 31.

The contact member 24 according to the present invention is so constructed as to be vertically adjustable. More specifically, the contact member 24 is formed with an external thread 33 at the outer periphery of its upper part, and a cap nut 35 formed with an internal thread 34 on its inwall is threadably engaged with the external thread 33. As shown in FIG. 2, the actuating rod 10 penetrates through the central part of the cap nut 35. At the penetrating part the actuating rod 10 is made thinner so that the cap nut 35 may be prevented from moving downwards. Additionally, at the boundary part of the actuating rod 10 projecting out of the cap nut 35, a snap ring or the like 36 is disposed so that the cap nut 35 may be prevented from coming off the actuating rod 10. The contact member 24 can accordingly be adjusted vertically with respect to the actuating rod 10 in such way that, after the lock nut 26 and bolt 25 which fix the contact member 24 to the actuating rod 10 are loosened, the cap nut 35 is turned. After setting the position of the contact member 24, the bolt 25 and the lock nut 26 are tightened again.

According to the present invention, where the spacing between the pointed end of the capillary and the electrode portion of the element of the semiconductor device placed on the guide base 15 is too short or long, the contact member 24 is upwardly or downwardly moved and adjusted by loosening the bolt 25 as well as the lock nut 26 and thereafter turning the cap nut 25 as has been stated above. Consequently, the position of the lower surface of the flange portion 9 is changed, the position of the arm end part in contact with the lower surface is thus changed, and the position of the lower end of the capillary 8 is changed. Accordingly, by setting with the cap nut 35 the lowermost point of the capillary 8 to which it is brought by the cam, the disadvantages encountered in the prior art such as insufficient bonding of the wire and disconnection of the wire attributed to excessive crush are prevented.

The wire bonding equipment of the present invention is not restricted to the embodiment, but the actuating rod and the contact member for vertically controlling the arm may be provided with an adjusting mechanism.

As described above, according to the wire bonding equipment of the present invention, the descent stop position of the capillary can be delicately adjusted, and hence, the crush allowance for the wire can be freely set, so that the troubles of disconnection ascribable to the inferior bonding or excessive crush of the wire are preventable. The yield of the wire bonding is accordingly enhanced.

While we have shown and described only one embodiment in accordance with the present invention, it is understood that the same is not limited thereto but is susceptible of numerous changes and modifications as known to those skilled in the art, and we therefore do not wish to be limited to the details shown and described herein but intend to cover all such changes and modifications as are encompassed by the scope of the appended claims.

What we claim is:

1. A wire bonding arrangement comprising: an axially displaceably mounted actuating rod means having a control portion on one end thereof, cam means for displacing said actuating rod means in a Z direction, said actuating rod means being operatively engageable with the outer periphery of said cam means, arm means, one end of which is in operative contact with said control portion of said actuating rod means, capillary means provided at the other end of said arm means, means for rockably supporting said arm means substantially at the central part thereof, means for adjusting the position of said control portion, and means for mounting said arm means for displacement in the horizontal X and Y directions.

2. An arrangement according to claim 1, wherein said control portion includes a flange means provided on said actuating rod means, and wherein said arm means is provided with contact means for engaging said flange means.

3. An arrangement according to claim 2, wherein means are provided for normally biasing said actuating rod means into operative engagement with said cam means.

4. An arrangement according to claim 3, wherein means are provided for normally biasing said contact means into engagement with said flange means.

5. An arrangement according to claim 4, wherein said contact means includes a substantially spherical protrusion provided on said one end of said arm means.

6. An arrangement according to claim 5, wherein means are provided for guiding the movement of said actuating rod means.

7. An arrangement according to claim 6, wherein said means for guiding includes a guide sleeve, said actuating rod means being disposed in said guide sleeve.

8. An arrangement according to claim 7, wherein means are provided for preventing said actuating rod means from turning in said guide sleeve.

9. An arrangement according to claim 8, wherein said last-mentioned means includes an axially extending groove provided in at least a portion of said actuating rod means and means receivable in said guide sleeve engageable in said axially extending groove.

10. An arrangement according to claim 9, wherein said flange means is provided on a contact member disposed on said actuating rod means, and wherein means are provided for securing said contact member to said actuating rod means.

11. An arrangement according to claim 10, wherein at least a portion of said contact member is threaded, and wherein said means for adjusting includes a threaded member operatively connected with said actuating rod means and receivable on the threaded portion of said contact member.

12. An arrangement according to claim 11, wherein said threaded member includes an aperture disposed therein, at least a portion of said actuating rod means extending through said aperture, and wherein said means for adjusting further includes a threaded portion provided on said portion of said actuating rod means extending through said aperture, and means for securing said actuating rod means relative to said contact member.

13. An arrangement according to claim 12, wherein means are provided for adjusting said capillary.

14. An arrangement according to claim 13, wherein said means for adjusting said capillary includes a threaded member connected to said means for normally biasing said contact means into engagement with said flange means.

15. An arrangement according to claim 1, wherein means are provided for normally biasing said actuating rod means into operative engagement with said cam means.

16. An arrangement according to claim 1, wherein means are provided for normally biasing said contact means into engagement with said control portion.

17. An arrangement according to claim 1, wherein means are provided for guiding the movement of said actuating rod means.

18. An arrangement according to claim 1, wherein said control portion includes a contact member disposed on said actuating rod means, and wherein means are provided for securing said contact member to said actuating rod means.

19. An arrangement according to claim 18, wherein at least a portion of said contact member is threaded, and wherein said means for adjusting includes a threaded member operatively connected with said actuating rod means and receivable on the threaded portion of said contact member.

20. An arrangement according to claim 19, wherein said threaded member includes an aperture disposed therein, at least a portion of said actuating rod means extending through said aperture, and wherein said means for adjusting further includes a threaded portion provided on said portion of said actuating rod means extending through said aperture, and means for securing said actuating rod means relative to said contact member.

21. An arrangement according to claim 1, wherein means operatively connected with said arm means are provided for adjusting said capillary.

* * * * *